US010051266B2

(12) United States Patent
Hwang et al.

(10) Patent No.: US 10,051,266 B2
(45) Date of Patent: Aug. 14, 2018

(54) APPARATUS AND METHOD FOR TRANSMITTING AND RECEIVING HYBRID PACKETS IN A BROADCASTING AND COMMUNICATION SYSTEM USING ERROR CORRECTION SOURCE BLOCKS AND MPEG MEDIA TRANSPORT ASSETS

(71) Applicant: Samsung Electronics Co. Ltd., Suwon-si, Gyeonggi-do (KR)

(72) Inventors: Sung-Hee Hwang, Suwon-si (KR); Hyun-Koo Yang, Seoul (KR); Kyung-Mo Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 304 days.

(21) Appl. No.: 14/051,925

(22) Filed: Oct. 11, 2013

(65) Prior Publication Data
US 2014/0105310 A1    Apr. 17, 2014

(30) Foreign Application Priority Data

Oct. 11, 2012  (KR) .................. 10-2012-0113112

(51) Int. Cl.
*H04N 19/67* (2014.01)
*H04N 19/89* (2014.01)
*H03M 13/35* (2006.01)
*H04N 21/643* (2011.01)
*H03M 13/29* (2006.01)

(52) U.S. Cl.
CPC .. *H04N 19/00933* (2013.01); *H03M 13/2906* (2013.01); *H03M 13/356* (2013.01); *H04N 21/643* (2013.01)

(58) Field of Classification Search
None
See application file for complete search history.

(56) References Cited

U.S. PATENT DOCUMENTS

| 2007/0140361 | A1* | 6/2007 | Beales ................ H04L 1/20 375/259 |
| 2010/0211690 | A1 | 8/2010 | Pakzad et al. |
| 2011/0206022 | A1* | 8/2011 | Grewe ............. H04L 1/0083 370/338 |
| 2011/0208829 | A1 | 8/2011 | Kwon et al. |
| 2011/0219138 | A1 | 9/2011 | Cho et al. |

(Continued)

OTHER PUBLICATIONS

Hwang et al., "D1-FEC EE Samsung Proposal" ISO/IEV JTC1/SC29/WG11. MPEG2011/M21539. Nov. 2011, Geneva, Switzerland.*

(Continued)

*Primary Examiner* — William C Vaughn, Jr.
*Assistant Examiner* — Joseph A Towe
(74) *Attorney, Agent, or Firm* — Jefferson IP Law, LLP

(57) ABSTRACT

A method of transmitting a complex content packet in a broadcasting and communication system is provided. The method includes creating an Forward Error Correction (FEC) source block by using at least one MMT Processing Unit (MPU) included in at least one MPEG Media Transport (MMT) asset, and transmitting the FEC source block, wherein the FEC source block is generated so that a boundary of the at least one MPU and a boundary of the FEC source block do not deviate.

8 Claims, 7 Drawing Sheets

(56) References Cited

U.S. PATENT DOCUMENTS

| | | | |
|---|---|---|---|
| 2011/0249181 A1* | 10/2011 | Iwami | H04N 21/242 348/501 |
| 2011/0255558 A1 | 10/2011 | Hwang et al. | |
| 2012/0185907 A1 | 7/2012 | Park et al. | |
| 2012/0240174 A1* | 9/2012 | Rhyu | H04N 21/643 725/109 |
| 2013/0254631 A1* | 9/2013 | Luby | H03M 13/356 714/776 |
| 2014/0036999 A1* | 2/2014 | Ryu | H04N 19/50 375/240.12 |

OTHER PUBLICATIONS

Park et al. "Information technology—High efficiency coding and media delivery in heterogeneous environments—Part 1: MPEG media transport (MMT)", Geneva, Switzerland, Jan. 2013.*

Hwang et al., "D1-FEC EE Samsung Proposal" ISO/IEV JCT1/SC29A/WG11. MPEG2011/M21539. Nov. 2011, Geneva, Switzerland.*

ISO/IEC, Information technology—High efficiency coding and media delivery in heteroneous environments—part 1: MPEG media transport (MMT), 101. MPEG Meeting; Jul. 20, 2012, Stockholm, MPEG ISO/IEC JTC1/SC29/WG11, ISO/IEC CD 23008-1, No. N12894, Sep. 18, 2012, pp. 1-11 and pp. 35, 41-47, XP030019366.

Sunghee Hwang et al., D1-FEC EE Samsung Proposal, 98. MPEG Meeting; Nov. 28, 2011-Dec. 2, 2011, Geneva, Switzerland, MPEG ISO/IEC JTC1/SC29/WG11, No. m21539, Oct. 23, 2011, XP030050102.

ISO/IEC, Text of ISO/IEC 2nd CD 23008-1MPEG Media Transport, 103. MPEG Meeting; Jan. 21, 2013-Jan. 25, 2013, MPEG ISO/IEC JTC1/SC29/WG11, No. N13293, Feb. 12, 2013, pp. 113-115, XP030020043.

Sunghee Hwang et al., Samsung Proposal for MPU Mapping to FEC Source Block, 102. MPEG Meeting; Oct. 15, 2012-Oct. 19, 2012, Shanghai, MPEG ISO/IEC JTC1/SC29/WG11, No. m26965, Oct. 11, 2012, XP030055298.

* cited by examiner

APPARATUS AND METHOD FOR TRANSMITTING AND RECEIVING HYBRID PACKETS IN A BROADCASTING AND COMMUNICATION SYSTEM USING ERROR CORRECTION SOURCE BLOCKS AND MPEG MEDIA TRANSPORT ASSETS

CROSS-REFERENCE TO RELATED APPLICATION(S)

This application claims the benefit under 35 U.S.C. § 119(a) of a Korean patent application filed on Oct. 11, 2012 in the Korean Intellectual Property Office and assigned Serial No. 10-2012-0113112, the entire disclosure of which is hereby incorporated by reference.

TECHNICAL FIELD

The present disclosure relates to an apparatus and method for transmitting and receiving a packet in a broadcasting and communication system.

BACKGROUND

According to the related art, generally content including only one or two multimedia sources have been consumed. However, as a result of an increasing of multimedia content and development of technologies, various kinds of multimedia content have been developed. For example, hybrid content has been developed. Such hybrid content includes the various kinds of the multimedia content.

In order to transmit such hybrid content, the multimedia content must be individually separated and thereafter each of the separated multimedia content is transmitted. For example, assuming that the hybrid content includes images, voices and applications including a widget and the like, the image data is transmitted through an image signal transmission method, the voice data is transmitted through a voice signal transmission method, and the data of the application such as a widget is transmitted through a file transmission method. The content, which are individually separated and transmitted as described above, are received by a receiving unit, and are thereafter reconstructed to be hybrid content.

As such hybrid content of a high capacity have increased, data confusion in a network has been gradually increased. Accordingly, the content which is transmitted by a transmitting unit are abnormally received by the receiving unit, and some content may be lost on a pathway associated therewith. Generally, because data is transmitted by unit of a packet, data loss occurs by unit of a packet. The receiving unit cannot read data in a lost packet. Therefore, such data loss causes deterioration of audio quality, degradation of video image quality or an image breaking, an omission of an insert title, a loss of a file, and the like, thereby inconveniencing a user.

According to the related art, a Forward Error Correction (FEC) scheme is a technology in which a transmitting unit uses a specific error correction code to encode transmitted data and a receiving unit detects and corrects an error of data, while transmitting and receiving the data. Generally, the FEC scheme is used in a real time service such as a radio channel, a mobile television, and the like. The FEC is used in a real time service because requesting retransmission of data which has failed to be received is meaningless (e.g., ineffective) in relation to providing the real time service. Further, an FEC scheme, which is performed in an application layer, among the FEC schemes is referred to as "Application Layer Forward Error Correction (AL-FEC)".

The AL-FEC performs FEC encoding and FEC decoding by unit of a source block constituted of the predetermined number of packets. The decoding by unit of a source block delays the decoding by a magnitude of the source block during the FEC decoding.

Further, in the case of compressed data such as an audio or a video, after carrying the FEC decoding, decoded data is input into a media decoder in order to decompress its compression. At this time, because the media decoder performs the decoding by unit of a predetermined size, the decoding is delayed by unit of a size of the data of which the media decoder performs the decoding.

Therefore, a unit by which the media decoder and the FEC decoder perform the decoding of data has an effect on a delay according to which a user may consume the desired content. Accordingly, a scheme in which a time delay can be minimized to consume the content is required.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an apparatus and method for constituting an Forward Error Correction (FEC) source block in order to minimize a decoding time delay of an MPEG Media Transport (MMT) asset constituted of at least one MMT Processing Unit (MPU) in the case in which an Application Layer Forward Error Correction (AL-FEC) is applied to a recovery of packet data damaged in a network.

Another aspect of the present disclosure is to provide an apparatus and method for generating an FEC source block from an MPU considering a boundary of the MPU and a boundary of the FEC source block, so that both boundaries do not deviate.

In accordance with an aspect of the present disclosure, a method of transmitting a hybrid content packet in a broadcasting and communication system is provided. The method includes generating an FEC source block by using at least one MPU included in at least one MMT asset, and transmitting the generated source block, wherein the FEC source block is generated so that a boundary of the at least one MPU and a boundary of the FEC source block do not deviate.

In accordance with an aspect of the present disclosure, the method further includes performing an FEC encoding for the generated FEC source block, wherein when the FEC source block is generated by using the at least one MPU included in the one MMT asset, the one FEC source block is constituted of only the MMT packets generated from the one MPU, or includes all MMT packets generated from the one MPU.

In accordance with an aspect of the present disclosure, when the FEC source block is generated by using the at least one MPU included in plural MMT assets, the one FEC source block may exclude different MMT packets generated from the at least one MPU included in the one MMT asset.

In accordance with an aspect of the present disclosure, the method may further include generating plural FEC sub-blocks from the generated FEC source block, and performing a sub-block encoding for the plural generated FEC sub-blocks.

In accordance with an aspect of the present disclosure, when the FEC source block is generated by using one or more MPUs included in the one MMT asset, in the generating of the FEC sub-blocks, one FEC sub-block is generated by using all MMT packet generated from one MPU, and the plural FEC sub-blocks are generated by using all MMT packet generated from one MPU, or the one FEC sub-block is generated by using the MMT packets generated from plural MPUs.

In accordance with an aspect of the present disclosure, the method may further include generating plural FEC sub-blocks from the generated FEC source block, and encoding at least one of the generated FEC sub-blocks, wherein when the FEC source block is generated by using at least one MPU included in the one MMT asset, the one FEC source block is constituted of only MMT packets generated from one MPU, or includes all MMT packets generated from one MPU.

In accordance with an aspect of the present disclosure, when an FEC source block is generated by using one or more MPUs included in the plural MMT asset, the FEC source block excludes different MMT packets generated from the plural MPUs included in the one MMT asset.

In accordance with an aspect of the present disclosure, an apparatus for transmitting a hybrid content packet in a broadcasting and communication system, which is provided according to another aspect of the present disclosure, is capable of performing all the above described.

In accordance with another aspect of the present disclosure, an apparatus of transmitting a hybrid content packet in a broadcasting and communication system is provided. The apparatus includes a source block generating unit configured to generate a Forward Error Correction (FEC) source block by using at least one MMT Processing Unit (MPU) included in at least one MPEG Media Transport (MMT) asset, and a transmitting unit configured to transmit the generated FEC source block. The FEC source block is generated so that a boundary of the at least one MPU and a boundary of the FEC source block do not deviate.

According to the present disclosure, a transmitting unit can provide a method for generating an FEC source block based on unit of MPU of an MMT asset, thereby minimizing a decoding delay time of the MMT asset.

According to the present disclosure, although a decoding of an FEC source block is failed, it is possible to prevent the decoding failure from being transferred to an MPU included in an FEC source block near the FEC source block, the decoding of which is failed. Accordingly, minimizing a decoding time of an MMT asset is possible, thereby providing a preferable broadcasting and communication service to a user.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

According to various embodiments of the present disclosure, a boundary of an MMT Processing Unit (MPU) and a boundary of a source block do not deviate from each other when the source block is generated in an MPEG Media Transport (MMT) system, thereby preventing a decoding delay from being generated during a decoding of the source block.

Various embodiments of the present disclosure described below, may be applied to an MMT. However, various embodiments of the present disclosure are not limited to application to an MMT. The discussion provided in relation to the various embodiments of the present disclosure applied to an MMT is only an example for a convenience of description. Accordingly, various embodiments of the present disclosure may be applied to technologies other than an MMT. Further, terms used in the specification is expressed by a reference of standards related to the MMT. However, such terms are only for a convenience of expression, and a substantial technical spirit is not limited to only the MMT standards.

Figure 1:
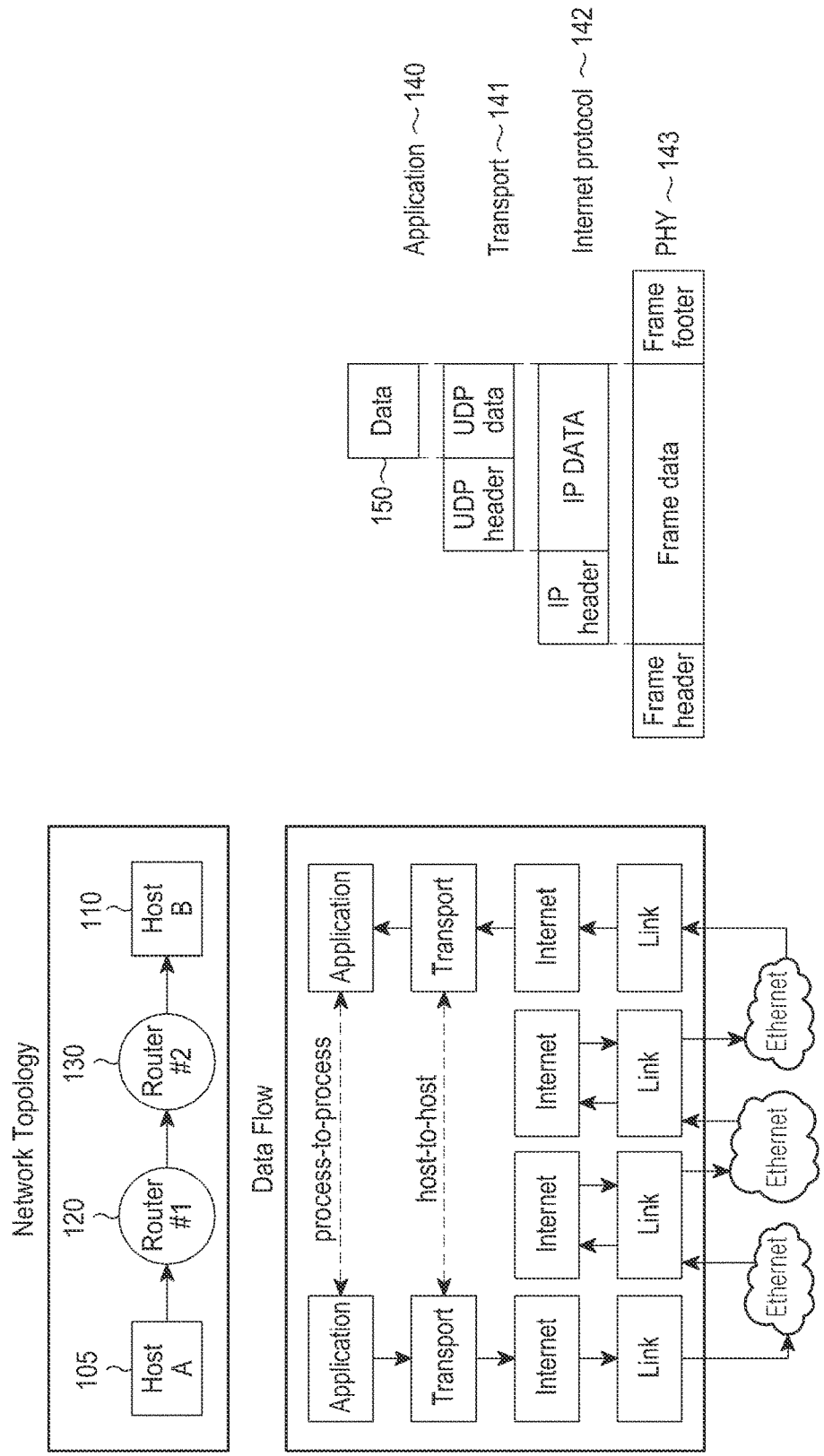
FIG. 1 is a block diagram illustrating a network topology and a data flow based on a general Internet Protocol (IP) according to an embodiment of the present disclosure.

FIG. 1 is a block diagram illustrating a network topology and a data flow based on a general Internet Protocol (IP) according to an embodiment of the present disclosure.

Referring to FIG. 1, a case in which a transmitting unit (host A) 105 transmits audio-video content to a receiving unit (host B) 110 in a streaming scheme by using a plurality of IP packets, and in which the audio-video content is transmitted via at least one router (a first router 120 and a second router 130) may be assumed.

The transmitting unit (host A) 105 transmits a data 150 to be transferred in an application layer 140 to a transport layer 141, and in the transport layer, a User Datagram Protocol (UDP) packet is created by adding an UDT to the data 150 to be transferred. Thereafter, in an IP layer 142, an IP packet is generated by adding an IP header to the UDP packet. Continuously, in a physical layer 143, a physical layer frame is generated by adding a frame header and frame footer to the IP packet. Thereafter, the physical layer frame 143 is transmitted to the receiving unit (host B) 110 via links of the routers 120 and 130. Because a data flow in the receiving unit (host B) 110 is an inverse relation to a data flow in the transmitting unit (host A) 105, the description of the data flow in the receiving unit will be omitted.

In contrast, a plurality of packets transmitted by the transmitting unit (host A) 105 does not arrive at the receiving unit (host B) 110 in a regular sequence by which the transmitting unit (host A) 105 transmits the packets. Accordingly, in the case in which the content is transmitted in the streaming scheme by using the plurality of the IP packets, giving a transmitting sequence to each IP packet is necessary.

Figure 2:
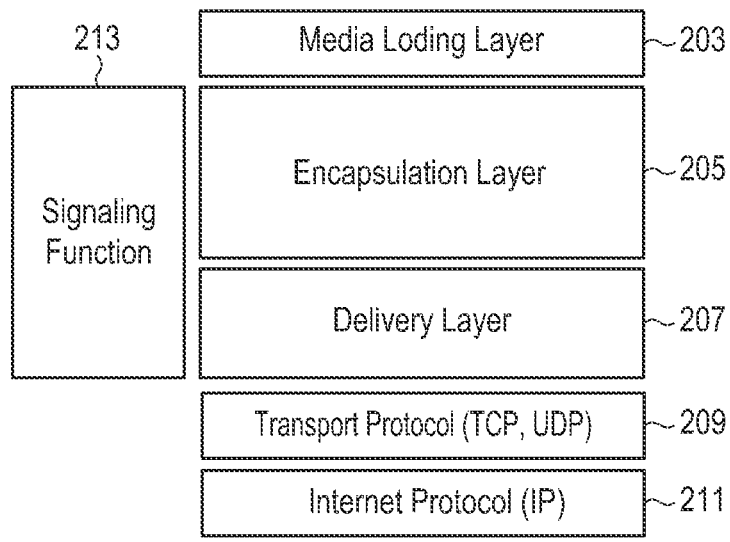
FIG. 2 is a block diagram illustrating a structure of an MPEG Media Transport (MMT) system according to an embodiment of the present disclosure.

FIG. 2 is a block diagram illustrating a structure of an interface of an MMT protocol according to an embodiment of the present disclosure.

Referring to FIG. 2, the MMT interface 200 includes a media encoding layer 203, an encapsulation layer 205, a delivery layer 207, a transport layer 209, an IP layer 211 and a signaling function 213.

The media encoding layer 203 compresses media data such as audio data and video data in a format of a basic unit to ensure that recording and transmitting the media data is easy. In addition, the media encoding layer 203 transmits the media data to the encapsulation layer 205.

The encapsulation layer 205 packages the compressed media data in the form similar to a file format, and transmits the media data to the delivery layer 207.

The encapsulation layer 205 defines a data unit format processed by an entity which conforms to an MMT package and an MMT regulation. The MMT package specifies the media content and elements including a relationship between the media content to provide information necessary for an adaptive transport. In the specification, the format of the data unit is defined so that an encoded media is stored, transmitted as a payload of a delivery protocol, or encapsulated to be easily converted between the payload and the media content or encoded media.

The delivery layer 207 formats an output of the encapsulation layer 205 as an MMT payload, and then, adds an MMT transmission packet header to the output of the encapsulation layer 205 so as to output the output of the encapsulation layer 205 to the transport protocol layer 209 in the form of the MMT transmission packet. Alternatively, the delivery layer 207 outputs the output of the encapsulation layer 205 to the transport protocol layer 209 in the form of an RTP packet by using a conventional RTP protocol. Further, the delivery layer 207 defines an application layer protocol and a format of a payload. The application layer protocol defined in the specification includes multiplexing and provides improved properties in comparison with an application layer protocol to deliver the multimedia content according to the related art. The payload format is defined in order to deliver encoded media data, regardless of a specific media type or an encoding scheme.

The transport protocol layer 209 converts the output of the delivery layer 207 into one transmitting protocol of the UDP and a Transmission Control Protocol (TCP), and then transmits the converted output of the delivery layer 209 to the IP layer 211.

Finally, the IP layer 211 makes the output of the transport protocol layer 209 be an IP packet. According to various embodiments of the present disclosure, the Forward Error Correction (FEC) packet may be at least one of an MMT payload format, an MMT transport packet, and an RTP packet.

The signaling function layer 213 defines a format to manage a consumption of the MMT package and a message format to manage a transport of the MMT package. A message to manage the consumption of the MMT package performs a signaling for a structure of the MMT package, and a message to manage a delivery of the MMT package performs a signaling for a structure of the payload format and a structure of the protocol.

Figure 3:
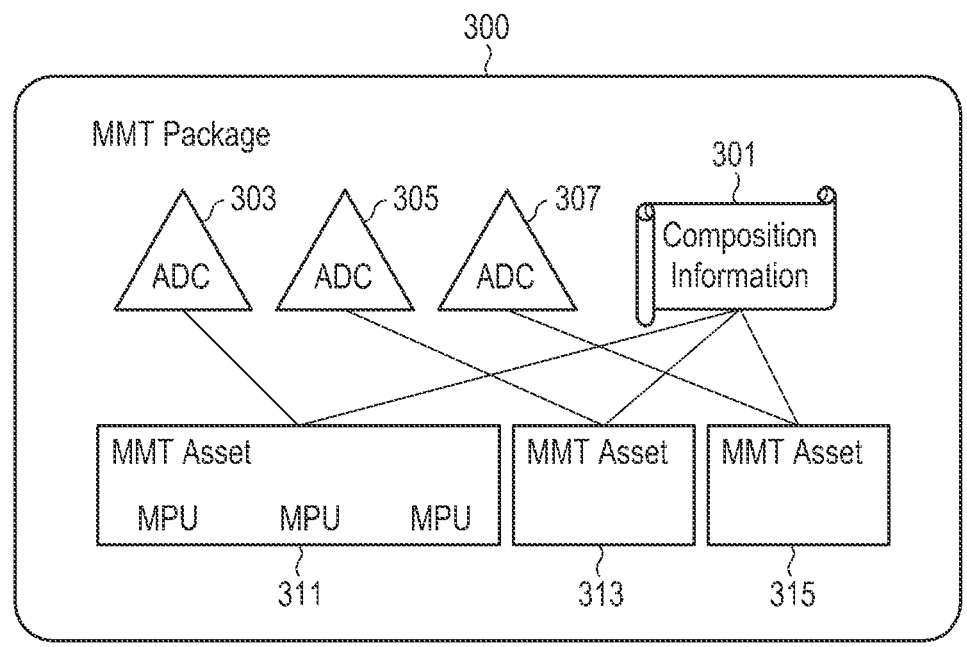
FIG. 3 is a block diagram illustrating a structure of an MMT packet according to an embodiment of the present disclosure.

FIG. 3 is a block diagram illustrating a structure of an MMT package according to an embodiment of the present disclosure.

Referring to FIG. 3, the MMT package 300 includes one MMT Composition Information (MMT-CI) 301, one or more MMT assets 311, 313, and 315, and one or more MMT Asset Delivery Characteristics (MMT-ADC) 303, 305 and 307.

Because the MMT package 300 is processed by unit of an MPU and the MMT asset is a collection of one or more MPUs which have an identical MMT asset ID, the one MMT package is constituted of one MMT-CI, one or more MPUs, and the MMT-ADC related to each MMT asset.

The MMT asset is a structural element of the MMT package which includes the encoded media data. The MMT asset is a logical structure which collectively refers to a group of the MPUs with an identical MMT asset ID, or data with various media formats which are defined by other standards. The MMT asset format is not defined in the specification.

The MMT-CI 301 describes information on a spatial and temporal relationship among the MMT assets for consumption and presentation. Further, the MMT-CI may be used to determine a delivery order of the MMT assets. The MMT-CI 301 may be delivered via one or more messages defined by the MMT standard, or a message of another means which is not defined by the MMT standard. A service supplier is capable of determining a carousel of the MMT-CI 301, and a frequency of the carousel.

The MMT-ADCs 303, 305 and 307 provide Quality of Service (QoS) information required for a transmission of the MMT assets. This information can be used to effectively delivery the MMT assets by making the MMT package in order to constitute the MMT payload and an MMT protocol parameter.

Figure 4:
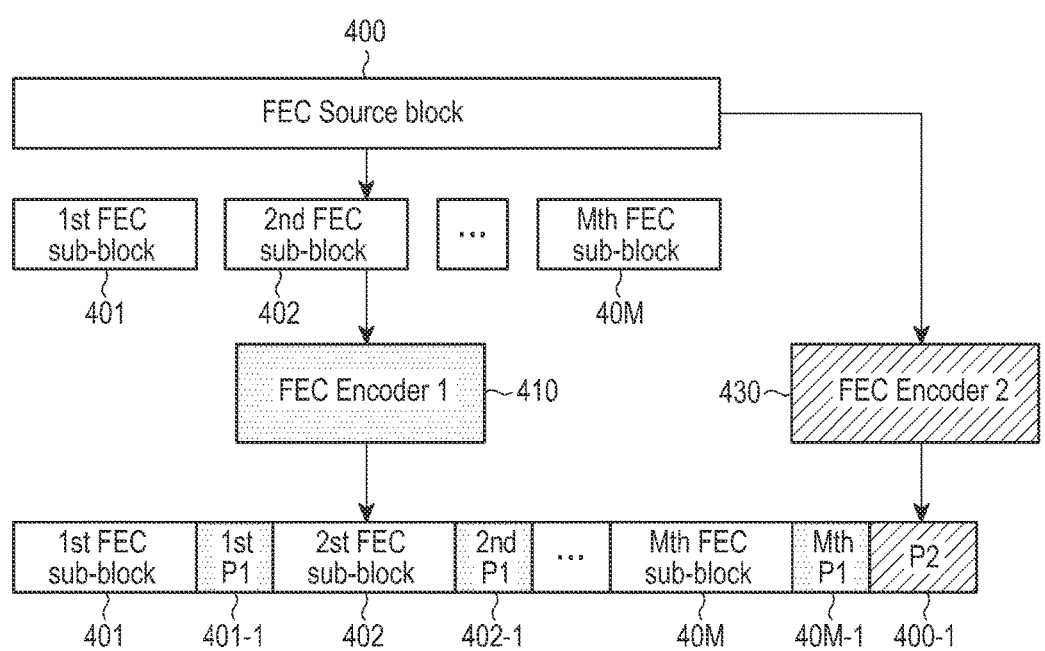
FIG. 4 is a block diagram illustrating a two stage Forward Error Correction (FEC) encoding scheme according to an embodiment of the present disclosure.

FIG. 4 is a block diagram illustrating an encoding scheme in a two stage FEC encoding device according to an embodiment of the present disclosure.

Hereinafter, for a convenience, it is possible to abbreviate or use "FEC source block" as/together with "source block", "FEC sub-block" as/together with "sub-block", "FEC encoding" as/together with "encoding", "FEC encoder" as/together "encoder", and "FEC parity" as/together with "parity".

Referring to FIG. 4, two stage FEC encoding scheme is to perform FEC encoding for a FEC source block by using two encoders 410 and 430, and to perform the FEC encoding for each of FEC sub-blocks 401, 402, . . . and 40M. A source block 400 is divided into an M number of sub-blocks 401, 402, . . . , and 40M, and each sub-block 401, 402, . . . , or 40M is encoded by a first encoder 410. Accordingly, parities 401-1, 402-1, . . . , and 40M-1 are added to the sub-blocks 401, 402, . . . , and 40M, respectively. Further, the source block 400 is encoded by a second encoder 430 and has a parity 400-1 added to the whole source block 400. The source block 400 encoded as described above is transmitted through a transmitter (not shown).

The above description corresponds to a case that both the source block and the sub-blocks are encoded. A possible encoding scheme including the above description can be classified into four cases.

(1) Case 0: a case in which the FEC encoding is not applied to both the source block and the sub-blocks.

(2) Case 1: a case of "one stage sub-block encoding" in which the encoding is not applied to only the sub-blocks.

(3) Case 2: a case of "one stage source block encoding" in which the encoding is applied to only the source block.

(4) Case 3: a case of "two stage encoding" in which the encoding is applied to both the sub-block and source block.

Referring to FIG. 4 again, all sub-blocks 401, 402, . . . , 40M generated from one source block 400 are connected in order to create one information block. The M number of P1 parity blocks 401-1, 402-1, . . . , and 40M-1 are created by an encoder one 402 from the M number of the FEC sub-blocks 401, 402, . . . , and 40M, and one parity block 400-1 is generated by an encoder two 404 from the source block 400.

Each case of the four possible encoding schemes will be described.

(1) In the case 0, a first encoding by the first encoder 410 and a second encoding by the second encoder 430 are omitted. For example, in the case 0, a parity data is not generated.

(2) In the case 1, M is set to 1. That M is 1 means that one source block generates one sub-block. In the case 1, the second encoding by the second encoder 430 is omitted. In contrast, in the case 2, the first encoding by the first encoder 402 is omitted.

(3) In the case 2, M also is set to 1. That M is 1 means that one source block generates one sub-block. In contrast, in the case 2, the first encoding by the first encoder 410 is omitted, differently from the case 1.

(4) In the case 3, one FEC source block can be divided into the number M (M>1) of sub-blocks. Each sub-block 401, 402, . . . , and 40M is encoded by the first encoder 410 and the source block 400 is encoded by the second encoder 430. In contrast, the M number of sub-blocks are converted into the M number of information sub-blocks by one of Information Block Generation (IBG) modes.

For reference, the MMT standard defines an IBG mode which generates an FEC information block from the FEC source block, and provides an IBG mode 0, an IBG mode 1, and an IBG mode 2. Further, one IBG mode is applied to all sub-blocks as well as one source block. The detailed description of each IBG mode will be omitted.

In contrast, according to various embodiments of the present disclosure, there are considered a case in which the source block is created from the MPUs included in one MMT asset and a case in which the source block is created from the MPUs included in a plurality of MMT assets. The former embodiment is described with reference to FIGS. 5A to 5C, and the latter embodiment is described with reference to FIGS. 6A and 6B.

FIGS. 5A, 5B, 5C, 6A, and 6B are views illustrating a structure of an MPU which is mapped by means of an FEC source block according to an embodiment of the present disclosure.

Figure 5C:
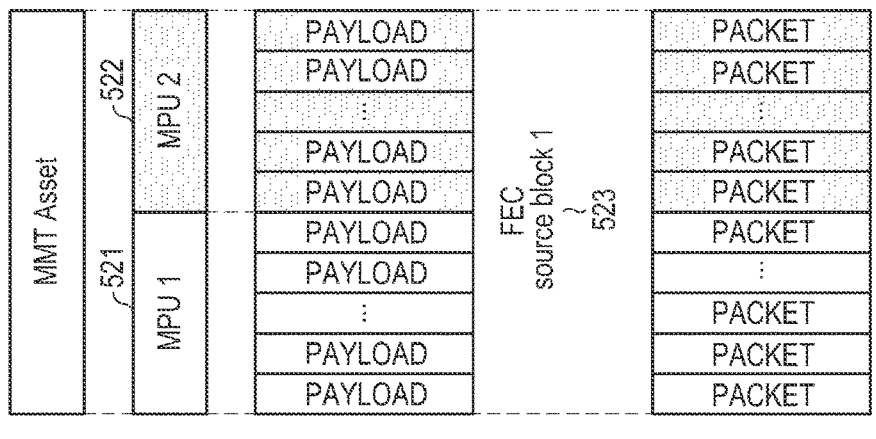
FIGS. 5A, 5B, 5C, 6A, and 6B are views illustrating a structure of an MMT Processing Unit (MPU) which is mapped by means of an FEC source block according to an embodiment of the present disclosure.
Figure 5B:
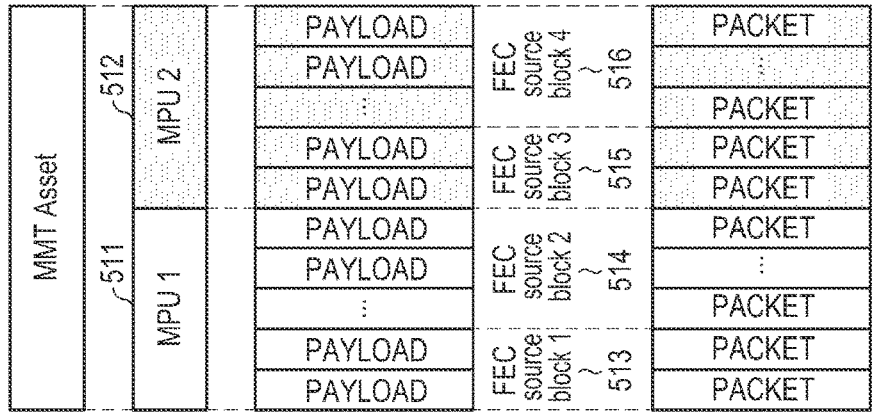
Figure 5A:
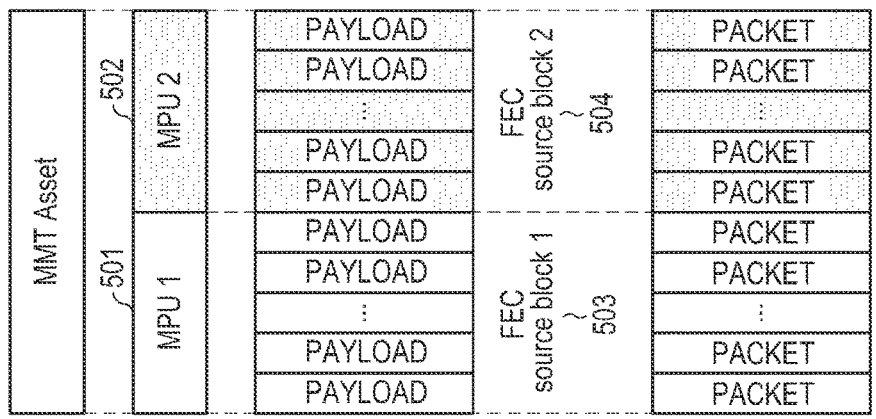

For example, FIGS. 5A, 5B, an 5C are views illustrating a mapped relationship structure of an MPU and a source block in a case in which the source block is generated from the MPUs included in one MMT asset, according to an embodiment of the present disclosure.

Referring to FIGS. 5A, 5B, an 5C, it is assumed that one MMT asset constituted of two MPUs is protected by the FEC. Further, in FIGS. 5A, 5B, an 5C, each MPU is divided into five MMT payloads, and an MMT packet header is added to each MMT payload. Finally, one MMT asset is constituted of ten MMT packets.

In FIG. 5A, one MMT asset is constituted of two source blocks. Particularly, a first source block 503 is constituted of first five MMT packets which are MMT packets of a first MPU 501. A second source block 504 is constituted of the next five MMT packets which are MMT packets of a second MPU 502.

In FIG. 5B, one MMT asset is constituted of four source blocks. Particularly, a first source block 513 is constituted of the first two MMT packets of the first MPU 511, and a second source block 514 is constituted of three residual MMT packets. A third source block 515 is constituted of the first two MMT packets of the second MPU 512, and a fourth source block 515 is constituted of three residual MMT packets.

In FIG. 5C, one MMT asset is constituted of one source block. Particularly, a first source block 523 is constituted of ten MMT packets of a first MPU 521 and a second MPU 522.

Figures 6A, 6B:
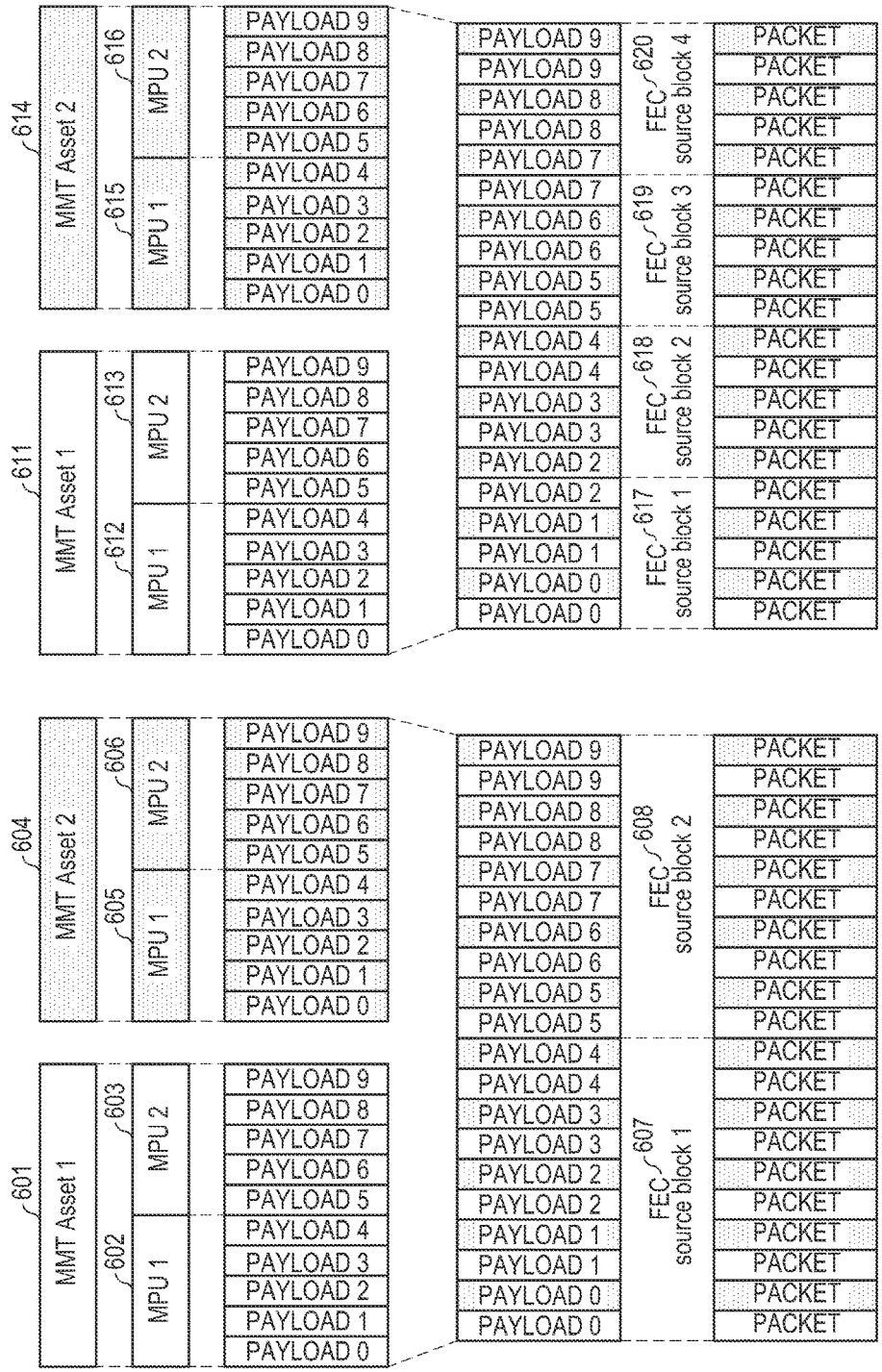

FIGS. 6A and 6B are views illustrating a mapped relation of a MPU and a source block in a case in which the source block is generated from the MPUs included in plural MMT assets, according to an embodiment of the present disclosure.

Referring to FIGS. 6A and 6B, it is assumed that one MMT asset is constituted of two MPUs and two MMT assets are protected by the FEC. Further, it is assumed that each MPU is divided into five MMT payloads, MMT payloads generated from two MMT assets are multiplexed with one another so as to constitute twenty MMT payloads, and MMT packet headers are added to the MMT payloads, respectively, so as to finally constitute twenty MMT packets.

In FIG. 6A, a first source block 607 is constituted of a total amount of ten MMT packets which include five MMT packets generated from a first MPU 602 of a first MMT asset 601, and five packets generated from a first MPU 605 of a second MMT asset 604. Further, a second source block 608 is constituted of a total amount of MMT packets which include five residual MMT packets generated from a second MPU 603 of a first MMT asset 601, and five residual MMT packets generated from a second MPU 606 of a second MMT asset 604.

In FIG. 6B, a first source block 617 is constituted of a total amount of five MMT packets which include three MMT packets from a head of a first MPU 612 in a first MMT asset one 611, and two packets from a head of a first MPU 615 in a second MMT asset 614. Further, a second source block 618 is constituted of a total amount of five MMT packets which include two residual MMT packets of a first MPU 612 in a first MMT asset one 611, and three residual packets of a first MPU 615 in a second MMT asset 614.

Further, a third source block 619 is constituted of a total amount of five MMT packets which include three MMT packets from a head of a second MPU 613 in the first MMT asset 611, and two packets from a head of a second MPU 616 in the second MMT asset 614. Furthermore, a fourth source block 620 is constituted of a total amount of five MMT packets which include two residual MMT packets of a second MPU 613 in the first MMT asset 611, and three residual packets of a second MPU 616 in the second MMT asset 614.

Hereinafter, processes of generating an FEC source block according to various embodiments of the present disclosure in consideration of cases of the FEC encoding shown in FIG. 4 and the number of MMT assets shown in FIGS. 5A to 6B will be described.

First, in the case 0 shown in FIG. 4, the FEC encoding is not applied to either the source block or the sub-block. Accordingly, in this case, because the FEC encoding is not performed, an FEC decoding delay does not occur. Therefore, according to various embodiments of the present disclosure, in this case, it is unnecessary to consider a source block generating scheme to minimize the FEC decoding delay.

Second, the case 1 shown in FIG. 4 indicates "one state sub-block encoding" in which the encoding is applied to only the sub-blocks. When the sub-block encoding of the case 1 is performed, each MPU constituting one MMT asset is made to be a packet as an MMT packet, and then the FEC source block is constituted of the predetermined number of MMT packets. Continuously, the FEC encoding for the FEC source block is performed by unit of a source block so as to generate an FEC parity block, and the FEC source block is made to be an FEC packet and transmitted. According to various embodiments of the present disclosure, in the case 1, a scheme of generating a source block using one MMT asset may be one of three types as follow.

Type 1. The FEC source block is constituted of MMT packets which are generated from one MPU. In this case, MMT packets generated from one MPU are equal to the MMT packets included in one FEC source block. This case corresponds to FIG. 5A. For example, as illustrated in FIG. 5A, the first source block 503 is constituted of the MMT packets generated from the first MPU 501.

Type 2. The N number (N>1) of FEC source blocks are constituted of the MMT packets generated from one MPU. In this case, MMT packets generated from one MPU are equal to the MMT packets included in the N number of FEC source blocks. This case corresponds to FIG. 5B. For example, as illustrated in FIG. 5B, the first source block 513 and the second source block 514 are constituted of the MMT packets generated from the first MPU 511.

Type 3. One source block is constituted of the MMT packets generated from the N number (N>1) of the MPUs. In this case, MMT packets generated from the number N of the MPUs are equal to the MMT packets included in one FEC source block. This case corresponds to FIG. 5C. For example, as illustrated in FIG. 5C, the source block one 523 is constituted of the MMT packets created from the first MPU 521 and the second MPU 522.

In the case 1 of including three schemes of constituting the source block using one MMT asset according to the embodiment of the present disclosure, one source block has to be constituted of only the MMT packets generated from one MPU, or has to include all MMT packets generated from one MPU.

Next, a scheme of constituting the FEC source block using the plural MMT assets and one stage sub-block encoding of the case 1 shown in FIG. 4 may be one of three types as follow.

Type 1. The FEC source block includes all MMT packets generated from one MPU in one MMT asset. This corresponds to FIG. 6A. For example, as illustrated in FIG. 6A, a first FEC source block 607 includes five MMT packets generated from a first MMT asset 601.

Type 2. The N number of the FEC source blocks include the MMT packets generated from one MPU in one MMT asset. This corresponds to FIG. 6B. For example, as illustrated in FIG. 6B, the first source block 617 and the second source block 618 include five MMT packets generated from the first MPU 612 in the first MMT asset 611.

Type 3. The FEC source block includes all MMT packets created from the N number (N>1) of MPUs in one MMT asset. Although it is not shown in FIGS. 6A and 6B, this case corresponds to a case in which one source block is constituted of all MMT packets included in two source blocks 607 and 608 in FIG. 6A, or a case that one source block is constituted of all MMT packets included in four source blocks 617, 618, 619 and 620 in FIG. 6B.

In the first case of including three schemes of constituting a source block using the plural MMT assets according to various embodiments of the present disclosure, the source block does not include packets which are generated from the plural MPUs included in one MMT asset and are different from one another. For example, one source block cannot include the MMT packets generated from the plural MPUs in one MMT asset, except for the third case described with reference to FIGS. 6A and 6B (the case in which one source block includes all MMT packets created from the plural MPUs). For example, it is assumed that one MMT asset is constituted of a first MPU and a second MPU, MMT packets one to ten are generated from the first MPU, and MMT packets eleven to twenty are generated from the second MPU. In this case, the FEC source block cannot be constituted of only the MMT packets such as the MMT packets six to fifteen, of which some are generated from the first MPU, and some are created from the second MPU. Similarly, the FEC source block cannot be constituted of the MMT packets one to fifteen or the MMT packets six to twenty. However, the FEC source block can be constituted of the MMT packets one to twenty. The reason is because the FEC source block includes all packets created from different MPUs.

Third, the second case described with reference to FIG. 4 indicates "one stage source block encoding" in which the encoding is applied to only the source block. The second case can be classified into a case of generating a source block from one MMT asset, and a case of generating a source block from plural MMT assets. However, a scheme of generating the source block in the second case is identical to the scheme of creating a source block in the first case.

Fourth, the third case described with reference to FIG. 4 indicates "two stage encoding" in which the encoding is applied to both the sub-block and the source block. The third case can be classified into a case of generating a source block from one MMT asset, and a case of generating a source block from plural MMT assets.

In the third case, the scheme of generating the source block from one MMT asset may be one of three types as follow. For reference, each MPU constituting the MMT asset is made to be an MMT packet, and an FEC source block constituted of the predetermined number of the MMT packets is generated. The generated source block is divided into the M number (M>1) of sub-blocks, and a first FEC encoding of the source block is performed by a unit of a sub-block, so as to create first parity blocks. In contrast, a second FEC encoding of the source blocks is performed by unit of a source block, so as to generate a second parity block. Then, the second parity block is made to be an FEC packet and transmitted. A scheme of creating the FEC source block may be one of three types as follows.

Type 1. The FEC source block is constituted of MMT packets which are generated from one MPU. In this case, MMT packets generated from one MPU are equal to the MMT packets included in one FEC source block. This case corresponds to FIG. 5A. For example, as illustrated in FIG. 5A, the first source block 503 is constituted of the MMT packets generated from the first MPU 501.

Type 2. The N number (N>1) of FEC source blocks are constituted of the MMT packets generated from one MPU. In this case, MMT packets created from one MPU are equal to the MMT packets included in the N number of FEC source blocks. This case corresponds to FIG. 5B. For example, as illustrated in FIG. 5B, the first source block 513 and the second source block 514 are constituted of the MMT packets generated from the first MPU 511.

Type 3. The FEC source block is constituted of MMT packets which are generated from the N number (N>1) of MPUs. In this case, MMT packets generated from the number N of the MPUs are equal to the MMT packets included in one FEC source block. This case corresponds to FIG. 5C. For example, in FIG. 5C, the source block one 523 is constituted of the MMT packets created from the first MPU 521 and the second MPU 522. For example, in consideration of the above-mentioned three cases, one source block is constituted of only the MMT packets created from one MPU, or has to include all MMT packets created from the one MPU.

In contrast, a concrete method of constituting FEC sub-blocks for one FEC source block is as follows.

A. The sub-blocks are constituted by using all MMT packets generated from one MPU. In this case, MMT packets created from one MPU are equal to the MMT packets included in one FEC source block.

B. The R number (R<M) of sub-blocks are constituted by using all MMT packets generated from one MPU. In this case, MMT packets created from one MPU are equal to the MMT packets included in the R number of sub-blocks.

C. One sub-block is constituted by using the MMT packets created from the R number (R<N) of MPUs. In this case, MMT packets generated from the R number of MPUs are equal to the MMT packets included in one sub-block.

In the third case, next, the scheme of generating the source block from one MMT asset may be one of three types as follow. For reference, the MPUs constituting each MMT asset are made to be MMT packets, and then the MMT packets are multiplexed with one another so as to create a MMT packet stream. Then, an FEC source block constituted of a predetermined number of MMT packets is created, and is divided into the M number (M>1) of FEC sub-blocks. The FEC source block is subjected to a first FEC encoding by a unit of an FEC sub-block, so that first parity blocks are created. In contrast, a second FEC encoding of the FEC source blocks is performed by a unit of a source block, so as to create a second parity block. Then, the second parity block is made to be an FEC packet and transmitted. A scheme of creating the FEC source block may be one of three types as follows.

Type 1. The FEC source block includes all MMT packets generated from one MPU included in one MMT asset. In this case, MMT packets generated from one MPU included in one MMT asset are equal to the MMT packets included in one FEC source block.

Type 2. The N number (N>1) of FEC source blocks are constituted of the MMT packets generated from one MPU included in one MMT asset. In this case, MMT packets generated from one MPU included in one MMT asset are equal to the MMT packets included in N FEC source blocks.

Type 3. The FEC source block includes all MMT packets created from the N number (N>1) of MPUs in one MMT asset. In this case, MMT packets created from the N (N>1) number of MPU included in one MMT asset are equal to the MMT packets included in the FEC source block. In contrast, a concrete method of constituting FEC sub-blocks for one FEC source block is as follows.

A. The sub-blocks are constituted by using all MMT packets created from one MPU among the N (N>1) number of MPUs. In this case, MMT packets generated from one MPU are equal to the MMT packets included in one FEC sub-block.

B. One sub-block is constituted by using the MMT packets created from the R (R<N) number of MPUs among the N number of MPUs. In this case, MMT packets created from the R number of MPUs are equal to the MMT packets included in one FEC sub-block.

C. The R (R<N) number of FEC sub-blocks are constituted by using all MMT packets generated from one MPU among the N number of MPUs. In this case, MMT packets created from one MPU are equal to the MMT packets included in the R number of FEC sub-blocks.

Up to now, in consideration of the cases of the FEC encoding by means of the two stage encoder of FIG. 4 and the case of generating the source block by using one or more MMT assets shown in FIGS. 5A to 6B, a scheme of generating a source block or a sub-block according to various embodiments of the present disclosure has been described.

In the schemes of generating the source block or the sub-block according to various embodiments of the present disclosure as described above, the source block or sub-block is generated from the MPU so that a boundary of the MPU and a boundary of the source block do not deviate in consideration of the boundary of the MPU and the boundary of the source block. Accordingly, it is possible to prevent a failure of the FEC encoding of the MPU in a current block and a time delay, which may occur when the boundary between the MPU and the source block is not distinguished, from being transferred to an MPU in an adjacent source block.

Figure 7:
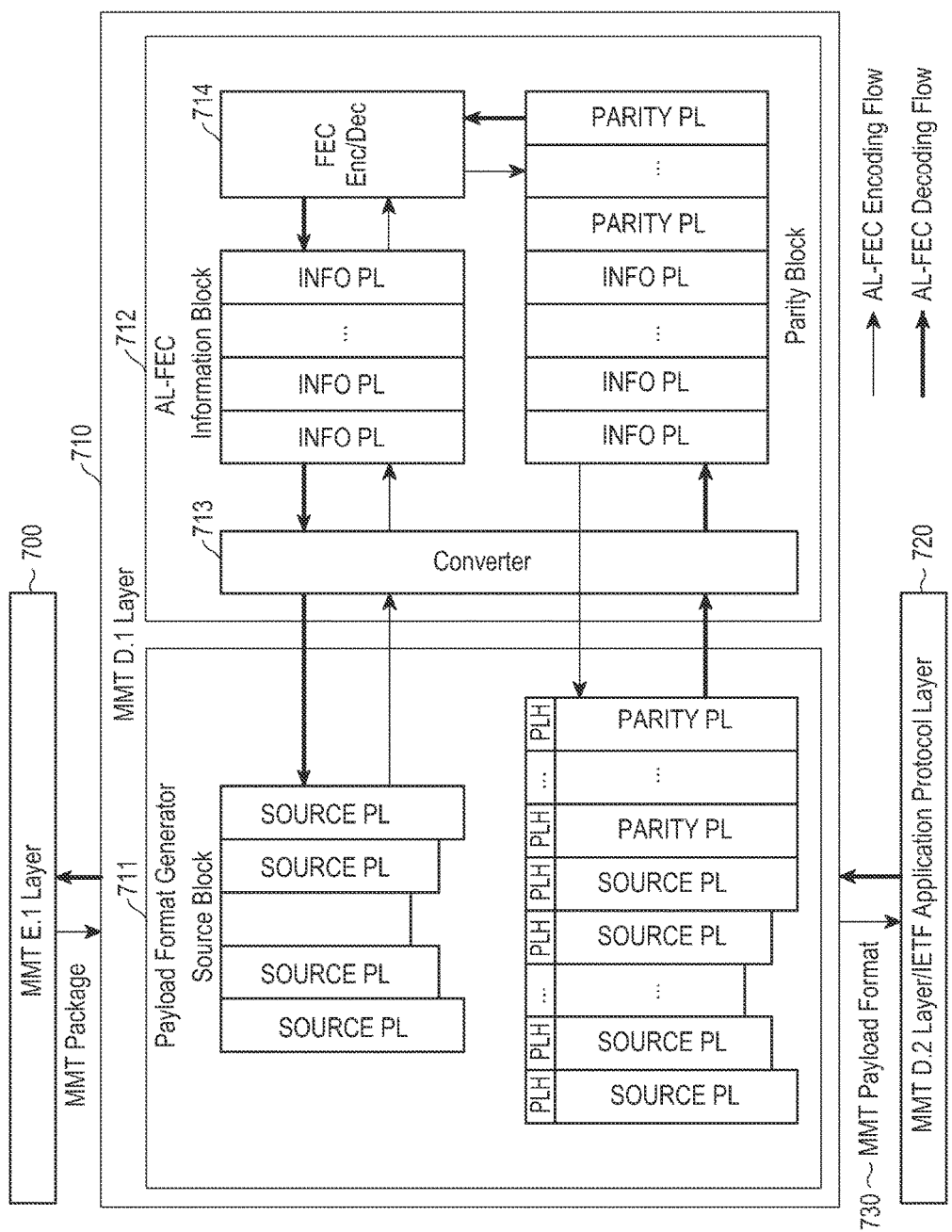
FIG. 7 is a block diagram illustrating encoding and decoding of an AL-FEC in an MMT system according to an embodiment of the present disclosure.

FIG. 7 is a block diagram illustrating encoding and decoding of an AL-FEC in an MMT system according to an embodiment of the present disclosure.

Referring to FIG. 7, the MMT system is constituted of an MMT E.1 layer 700, an MMT D.1 layer 710, an MMT D.2 layer/IETF application layer 720.

The MMT D.1 layer 710 includes a payload format generator 711 and an AL-FEC unit 712. The AL-FEC unit 712 includes an AL-FEC convertor 713 and an FEC encoding/decoding unit 714.

When the encoding is performed, the MMT D.1 layer 710 stores an MMT package (e.g., audio/video data, file, text, and/or the like) from the MMT E.1 layer 700, or receives formats created in consideration of a transmission so as to divide the format of the MMT package by a predetermined unit (FEC source payload is equal to MMT payload or MMT packet) to generate an FEC source block constituted of the predetermined number of the FEC source payloads.

The AL-FEC module convertor 713 converts the generated FEC source block into an FEC information block constituted of FEC information payloads with an identical length. The FEC encoding/decoding unit 714 performs an FEC encoding for FEC codes provided from the FEC information block so as to generate the FEC parity block, and transmits the FEC parity to the payload format generator 711.

The payload format generator 711 adds a Payload Header (PLH) including FEC relating signals to each source/parity/payload while adding the FEC parity block to the FEC source block, so that the MMT payload format 730 is made to be packets and transmitted to the MMT D.2 layer 720 or the IETF application layer (not shown). Further, an UDP header is added to the MMT payload format by means of a transmission protocol such as a UDP, and an IP header is also added to the MMT payload format. In the drawings, a case that the FEC source payload is an MMT payload is described as an example. As shown in FIGS. 5A to 6B, this is applicable to a case in which the FEC source payload is the MMT packet.

Decoding is performed in an inverse sequence of the above described encoding. Therefore, the detailed description of the decoding will be omitted because the decoding is easily understood through the description of the encoding process.

Figure 8:
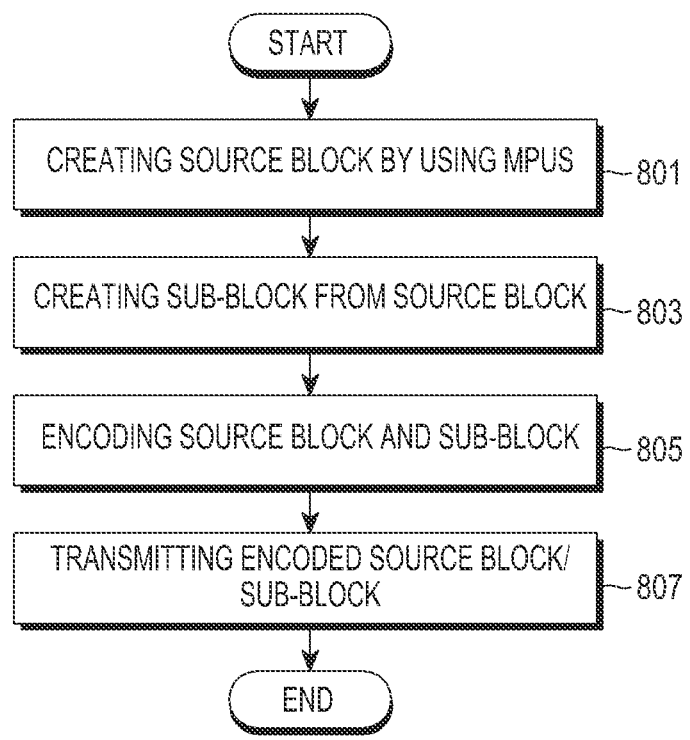
FIG. 8 is a flowchart illustrating a process of generating and transmitting MMT packets according to the embodiment of the present disclosure.

FIG. 8 is a flowchart illustrating a process of generating and transmitting MMT packets according to an embodiment of the present disclosure.

At operation 801, the FEC source block is generated from one or more MPUs. For example, the FEC source block is generated from one or more MPUs so that at least the boundary of the MPU does not deviate from the boundary of the source block. This is performed by a source block generator (not shown) of a transmitting unit (not shown).

At operation 803, the sub-blocks are created from the generated source block. However, if a sub-block encoding is not performed, operation 803 may be omitted. This is performed by the sub-block generator (not shown).

At operation 805, the source block encoding for the source block and/or the sub-block encoding for the sub-block are performed. For example, the source block encoding for the source bloc and/or the sub-block encoding for the sub-block is performed by the first encoder and the second encoder of FIG. 4.

At operation 807, the encoded source block and/or sub-block are transmitted. For example, the transmission of the encoded source block and/or sub-block is performed by the transmitting unit of the transmitter.

It will be appreciated that various embodiments of the present disclosure according to the claims and description in the specification can be realized in the form of hardware, software or a combination of hardware and software.

Any such software may be stored in a non-transitory computer readable storage medium. The non-transitory computer readable storage medium stores one or more programs (software modules), the one or more programs comprising instructions, which when executed by one or more processors in an electronic device, cause the electronic device to perform a method of the present disclosure.

Any such software may be stored in the form of volatile or non-volatile storage such as, for example, a storage device like a Read Only Memory (ROM), whether erasable or rewritable or not, or in the form of memory such as, for example, Random Access Memory (RAM), memory chips, device or integrated circuits or on an optically or magnetically readable medium such as, for example, a Compact Disk (CD), Digital Versatile Disc (DVD), magnetic disk or magnetic tape or the like. It will be appreciated that the storage devices and storage media are various embodiments of non-transitory machine-readable storage that are suitable for storing a program or programs comprising instructions that, when executed, implement various embodiments of the present disclosure. Accordingly, various embodiments provide a program comprising code for implementing apparatus or a method as claimed in any one of the claims of this specification and a non-transitory machine-readable storage storing such a program.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method of transmitting data in a communication system, the method comprising:
    obtaining at least one MPEG Media Transport (MMT) asset including at least one Media Processing Unit (MPU), each MPU including an identifier used to identify the MMT asset to which the MPU belongs;
    generating a forward error correction (FEC) source block including at least one MMT transport packet by using the at least one MPU included in the at least one MMT asset; and
    transmitting the generated FEC source block,
    wherein if one FEC source block is generated by using at least one MPU included in one MMT asset, the one FEC source block is generated by using only MMT transport packets generated from one MPU, or includes all MMT transport packets generated from the one MPU, and
    wherein, if the one FEC source block is generated by using plural MPUs included in plural MMT assets, the one FEC source block is generated so that the one FEC source block includes at least one of first MMT transport packets generated from a first MPU included in a first MMT asset and at least one of second MMT transport packets generated from a second MPU included in a second MMT asset and so that none of third MMT transport packets generated from a third MPU included in the first MMT asset and fourth MMT transport packets generated from a fourth MPU included in the second MMT asset are included within the one FEC source block, the third MPU being adjacent to the first MPU and the fourth MPU being adjacent to the second MPU.

2. The method of claim 1, further comprising:
    generating plural FEC sub-blocks from the generated FEC source block; and
    performing a sub-block encoding for the plural generated FEC sub-blocks.

3. The method of claim 2, wherein if the FEC source block is generated by using the at least one MPU included in the one MMT asset, in the generating of the FEC sub-blocks, one FEC sub-block is generated by using all MMT transport packets generated from one MPU, the plural FEC sub-blocks are generated by using all MMT transport packets generated from the one MPU, or the one FEC sub-block is generated by using the MMT transport packets generated from plural MPUs.

4. The method of claim 1, further comprising:
generating plural FEC sub-blocks from the generated FEC source block; and
encoding at least one of the generated FEC sub-blocks,
wherein if the FEC source block is generated by using at least one MPU included in one MMT asset, the one FEC source block is generated by using only MMT transport packets generated from the one MPU, or includes all MMT transport packets generated from the one MPU.

5. An apparatus of transmitting data in a broadcasting and communication system, the apparatus comprising:
at least one processor configured to:
obtain at least one MPEG Media Transport (MMT) asset including at least one Media Processing Unit (MPU), each MPU including an identifier used to identify the MMT asset to which the MPU belongs, and
generate a forward error correction (FEC) source block including at least one MMT transport packet by using the at least one MPU included in the at least one MMT asset; and
a transmitter configured to transmit the generated FEC source block,
wherein if one FEC source block is generated by using at least one MPU included in one MMT asset, the one FEC source block is generated by using only MMT transport packets generated from one MPU, or includes all MMT transport packets generated from the one MPU, and
wherein, if the one FEC source block is generated by using plural MPUs included in plural MMT assets, the one FEC source block is generated so that the one FEC source block includes at least one of first MMT transport packets generated from a first MPU included in a first MMT asset and at least one of second MMT transport packets generated from a second MPU included in a second MMT asset and so that none of third MMT transport packets generated from a third MPU included in the first MMT asset and fourth MMT transport packets generated from a fourth MPU included in the second MMT asset are included within the one FEC source block, the third MPU being adjacent to the first MPU and the fourth MPU being adjacent to the second MPU.

6. The apparatus of claim 5,
wherein the at least one processor is further configured to generate plural FEC sub-blocks from the generated FEC source block, and
wherein the apparatus further comprises a second encoder configured to perform sub-block encoding for the at least one generated FEC sub-block.

7. The apparatus of claim 6, wherein if the FEC source block is generated by using the at least one MPU included in the one MMT asset, the sub-at least one processor is further configured to generate one FEC sub-block by using all MMT transport packets generated from one MPU, the plural FEC sub-blocks by using all MMT transport packets generated from the one MPU, or the one FEC sub-block by using the MMT transport packets generated from plural MPUs.

8. The apparatus of claim 5, further comprising:
wherein the at least one processor is further configured to generate plural FEC sub-blocks from the generated FEC source block,
wherein the apparatus further comprises a second encoder configured to encode at least one of the generated FEC sub-blocks, and
wherein if the FEC source block is generated by using at least one MPU included in one MMT asset, the one FEC source block is generated by using only MMT transport packets generated from the at least one MPU, or includes all MMT transport packets generated from the at least one MPU.

* * * * *